United States Patent
Sandhu

(10) Patent No.: US 7,923,373 B2
(45) Date of Patent: Apr. 12, 2011

(54) PITCH MULTIPLICATION USING SELF-ASSEMBLING MATERIALS

(75) Inventor: Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 914 days.

(21) Appl. No.: 11/757,846

(22) Filed: Jun. 4, 2007

(65) Prior Publication Data

US 2008/0299774 A1    Dec. 4, 2008

(51) Int. Cl.
*H01L 21/311*    (2006.01)

(52) U.S. Cl. ........ 438/696; 427/198; 427/180; 427/183; 427/189; 427/430.1; 438/689; 438/690; 216/37; 216/67

(58) Field of Classification Search .......... 427/198, 427/430.1, 180, 183, 189; 438/689, 690, 438/696; 216/37
See application file for complete search history.

(56) References Cited

U.S. PATENT DOCUMENTS

| | | |
|---|---|---|
| 4,234,362 A | 11/1980 | Riseman |
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,648,937 A | 3/1987 | Ogura et al. |
| 4,716,131 A | 12/1987 | Okazawa et al. |
| 4,776,922 A | 10/1988 | Bhattacharyya et al. |
| 4,838,991 A | 6/1989 | Cote et al. |
| 5,013,680 A | 5/1991 | Lowrey et al. |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,772,905 A | 6/1998 | Chou |
| 5,789,320 A | 8/1998 | Andricacos et al. |
| 5,795,830 A | 8/1998 | Cronin et al. |

(Continued)

FOREIGN PATENT DOCUMENTS

DE    42 36 609 A1    5/1994

(Continued)

OTHER PUBLICATIONS

Kim et al. Letters to Nature, vol. 424, Jul. 2003, pp. 412-415.*
Bruek, S.R.J., "Optical and interferometric lithography—Nanotechnology enablers," *Proceedings of the IEEE*, vol. 93, No. 10, Oct. 2005, pp. 1704-1721.
Sheats et al., "Microlithography: Science and Technology," *Marcel Dekkar, Inc.*, pp. 104-105 (1998).
U.S. Office Action issued Jun. 2, 2008 in U.S. Appl. No. 11/219,067, filed Sep. 1, 2005.

(Continued)

*Primary Examiner* — Lan Vinh
*Assistant Examiner* — Maki A Angadi
(74) *Attorney, Agent, or Firm* — Knobbe, Martens, Olson & Bear, LLP

(57) ABSTRACT

Self-assembling materials, such as block copolymers, are used as mandrels for pitch multiplication. The copolymers are deposited over a substrate and directed to self-assemble into a desired pattern. One of the blocks forming the block copolymers is selectively removed. The remaining blocks are used as mandrels for pitch multiplication. Spacer material is blanket deposited over the blocks. The spacer material is subjected to a spacer etch to form spacers on sidewalls of the mandrels. The mandrels are selectively removed to leave free-standing spacers. The spacers may be used as pitch-multiplied mask features to define a pattern in an underlying substrate.

36 Claims, 9 Drawing Sheets

U.S. PATENT DOCUMENTS

| | | | |
|---|---|---|---|
| 5,830,332 | A | 11/1998 | Babich et al. |
| 5,899,746 | A | 5/1999 | Mukai |
| 5,948,470 | A | 9/1999 | Harrison et al. |
| 5,998,256 | A | 12/1999 | Juengling |
| 6,004,862 | A | 12/1999 | Kim et al. |
| 6,010,946 | A | 1/2000 | Hisamune et al. |
| 6,042,998 | A | 3/2000 | Brueck et al. |
| 6,057,573 | A | 5/2000 | Kirsch et al. |
| 6,063,688 | A | 5/2000 | Doyle et al. |
| 6,071,789 | A | 6/2000 | Yang et al. |
| 6,110,837 | A | 8/2000 | Linliu et al. |
| 6,143,476 | A | 11/2000 | Ye et al. |
| 6,207,490 | B1 | 3/2001 | Lee |
| 6,211,044 | B1 | 4/2001 | Xiang et al. |
| 6,288,454 | B1 | 9/2001 | Allman et al. |
| 6,291,334 | B1 | 9/2001 | Somekh |
| 6,297,554 | B1 | 10/2001 | Lin |
| 6,319,853 | B1 | 11/2001 | Ishibashi et al. |
| 6,335,257 | B1 | 1/2002 | Tseng |
| 6,348,380 | B1 | 2/2002 | Weimer et al. |
| 6,362,057 | B1 | 3/2002 | Taylor, Jr. et al. |
| 6,383,907 | B1 | 5/2002 | Hasegawa et al. |
| 6,395,613 | B1 | 5/2002 | Juengling |
| 6,423,474 | B1 | 7/2002 | Holscher |
| 6,455,372 | B1 | 9/2002 | Weimer |
| 6,500,756 | B1 | 12/2002 | Bell et al. |
| 6,514,884 | B2 | 2/2003 | Maeda |
| 6,522,584 | B1 | 2/2003 | Chen et al. |
| 6,534,243 | B1 | 3/2003 | Templeton |
| 6,548,396 | B2 | 4/2003 | Naik et al. |
| 6,559,017 | B1 | 5/2003 | Brown et al. |
| 6,566,280 | B1 | 5/2003 | Meagley et al. |
| 6,573,030 | B1 | 6/2003 | Fairbairn et al. |
| 6,602,779 | B1 | 8/2003 | Li et al. |
| 6,632,741 | B1 | 10/2003 | Clevenger et al. |
| 6,638,441 | B2 | 10/2003 | Chang et al. |
| 6,667,237 | B1 | 12/2003 | Metzler |
| 6,673,684 | B1 | 1/2004 | Huang et al. |
| 6,686,245 | B1 | 2/2004 | Mathew et al. |
| 6,689,695 | B1 | 2/2004 | Lui et al. |
| 6,706,571 | B1 | 3/2004 | Yu et al. |
| 6,709,807 | B2 | 3/2004 | Hallock et al. |
| 6,734,107 | B2 | 5/2004 | Lai et al. |
| 6,744,094 | B2 | 6/2004 | Forbes |
| 6,773,998 | B1 | 8/2004 | Fisher et al. |
| 6,835,662 | B1 | 12/2004 | Erhardt et al. |
| 6,867,116 | B1 | 3/2005 | Chung |
| 6,875,703 | B1 | 4/2005 | Furukawa et al. |
| 6,893,972 | B2 | 5/2005 | Rottstegge et al. |
| 6,911,400 | B2 | 6/2005 | Colburn et al. |
| 6,924,191 | B2 | 8/2005 | Liu et al. |
| 6,926,953 | B2 * | 8/2005 | Nealey et al. ............ 428/220 |
| 6,955,961 | B1 | 10/2005 | Cheng |
| 6,962,867 | B2 | 11/2005 | Jackson et al. |
| 7,015,124 | B1 | 3/2006 | Fisher et al. |
| 7,074,668 | B1 | 7/2006 | Park et al. |
| 7,115,525 | B2 | 10/2006 | Abatchev et al. |
| 7,183,205 | B2 | 2/2007 | Hong |
| 7,183,597 | B2 | 2/2007 | Doyle |
| 7,208,379 | B2 | 4/2007 | Venugopal et al. |
| 7,271,107 | B2 | 9/2007 | Marks et al. |
| 7,288,445 | B2 | 10/2007 | Bryant et al. |
| 7,291,560 | B2 | 11/2007 | Parascandola et al. |
| 2002/0042198 | A1 | 4/2002 | Bjarnason et al. |
| 2002/0045308 | A1 | 4/2002 | Juengling |
| 2002/0063110 | A1 | 5/2002 | Cantell et al. |
| 2002/0068243 | A1 | 6/2002 | Hwang et al. |
| 2002/0094688 | A1 | 7/2002 | Mitsuiki |
| 2002/0127810 | A1 | 9/2002 | Nakamura et al. |
| 2003/0006410 | A1 | 1/2003 | Doyle |
| 2003/0044722 | A1 | 3/2003 | Hsu et al. |
| 2003/0109102 | A1 | 6/2003 | Kujirai et al. |
| 2003/0119307 | A1 | 6/2003 | Bekiaris et al. |
| 2003/0127426 | A1 | 7/2003 | Chang et al. |
| 2003/0157436 | A1 | 8/2003 | Manger et al. |
| 2003/0170995 | A1 | 9/2003 | Chou |
| 2003/0207207 | A1 | 11/2003 | Li |
| 2003/0207584 | A1 | 11/2003 | Sivakumar et al. |
| 2003/0215978 | A1 | 11/2003 | Maimon et al. |
| 2003/0216050 | A1 | 11/2003 | Golz et al. |
| 2003/0230234 | A1 | 12/2003 | Nam et al. |
| 2004/0000534 | A1 | 1/2004 | Lipinski |
| 2004/0017989 | A1 | 1/2004 | So |
| 2004/0018738 | A1 | 1/2004 | Liu |
| 2004/0023475 | A1 | 2/2004 | Bonser et al. |
| 2004/0023502 | A1 | 2/2004 | Tzou et al. |
| 2004/0043623 | A1 | 3/2004 | Liu et al. |
| 2004/0053475 | A1 | 3/2004 | Sharma |
| 2004/0079988 | A1 | 4/2004 | Harari |
| 2004/0106257 | A1 | 6/2004 | Okamura et al. |
| 2004/0235255 | A1 | 11/2004 | Tanaka et al. |
| 2005/0074949 | A1 | 4/2005 | Jung et al. |
| 2005/0112886 | A1 | 5/2005 | Asakawa et al. |
| 2005/0142497 | A1 | 6/2005 | Ryou |
| 2005/0153562 | A1 | 7/2005 | Furukawa et al. |
| 2005/0167394 | A1 | 8/2005 | Liu et al. |
| 2005/0186705 | A1 | 8/2005 | Jackson et al. |
| 2005/0272259 | A1 | 12/2005 | Hong |
| 2006/0003182 | A1 | 1/2006 | Lane et al. |
| 2006/0024940 | A1 | 2/2006 | Furukawa et al. |
| 2006/0024945 | A1 | 2/2006 | Kim et al. |
| 2006/0046161 | A1 | 3/2006 | Yin et al. |
| 2006/0046200 | A1 | 3/2006 | Abatchev et al. |
| 2006/0046201 | A1 | 3/2006 | Sandhu et al. |
| 2006/0046422 | A1 | 3/2006 | Tran et al. |
| 2006/0046484 | A1 * | 3/2006 | Abatchev et al. ............ 438/689 |
| 2006/0083996 | A1 | 4/2006 | Kim |
| 2006/0172540 | A1 | 8/2006 | Marks et al. |
| 2006/0189150 | A1 | 8/2006 | Jung |
| 2006/0211260 | A1 | 9/2006 | Tran et al. |
| 2006/0216923 | A1 | 9/2006 | Tran et al. |
| 2006/0231900 | A1 | 10/2006 | Lee et al. |
| 2006/0258159 | A1 * | 11/2006 | Colburn et al. ............... 438/694 |
| 2006/0263699 | A1 | 11/2006 | Abatchev et al. |
| 2006/0267075 | A1 | 11/2006 | Sandhu et al. |
| 2006/0273456 | A1 | 12/2006 | Sant et al. |
| 2006/0281266 | A1 | 12/2006 | Wells |
| 2007/0026672 | A1 | 2/2007 | Tang et al. |
| 2007/0045712 | A1 | 3/2007 | Haller et al. |
| 2007/0048674 | A1 | 3/2007 | Wells |
| 2007/0049011 | A1 | 3/2007 | Tran |
| 2007/0049030 | A1 | 3/2007 | Sandhu et al. |
| 2007/0049032 | A1 | 3/2007 | Abatchev et al. |
| 2007/0049035 | A1 | 3/2007 | Tran |
| 2007/0049040 | A1 | 3/2007 | Bai et al. |
| 2007/0050748 | A1 | 3/2007 | Juengling |
| 2007/0210449 | A1 | 9/2007 | Caspary et al. |
| 2007/0215874 | A1 | 9/2007 | Furukawa et al. |
| 2007/0215960 | A1 | 9/2007 | Zhu et al. |
| 2007/0249170 | A1 | 10/2007 | Kewley |
| 2007/0275309 | A1 | 11/2007 | Liu |
| 2007/0281219 | A1 | 12/2007 | Sandhu |
| 2008/0054350 | A1 | 3/2008 | Breitwisch et al. |
| 2008/0057687 | A1 | 3/2008 | Hunt et al. |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 57-048237 | 3/1982 |
| JP | 02-143527 | 6/1990 |
| JP | 03-003375 | 1/1991 |
| JP | 05343370 | 12/1993 |
| JP | H8-55908 | 2/1996 |
| JP | H8-55920 | 2/1996 |
| JP | 2003 155365 | 5/2003 |
| JP | 2004-152784 | 5/2004 |
| KR | 1999-0001440 | 1/1999 |
| KR | 1999-027887 | 4/1999 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |
| WO | WO 2005/034215 A1 | 4/2005 |
| WO | WO 2006/026699 | 3/2006 |
| WO | WO 2006/101695 | 9/2006 |
| WO | WO 2007/027686 | 3/2007 |

OTHER PUBLICATIONS

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

U.S. Office Action of Apr. 17, 2008 in U.S. Appl. No. 11/389,581, filed Mar. 23, 2006.

U.S. Office Action issued Jun. 25, 2009 in U.S. Appl. No. 11/445,907.

Yamaguchi et al., "Resist-pattern guided self-assembly of symmetric diblock copolymer," *Journal of Photopolymer Science and Technology*, vol. 19, No. 3, (2006), pp. 385-388.

Yang et al., "Guided self-assembly of symmetic diblock copolymer films on chemically nanopatterned substrates," *Macromolecules*, vol. 33, No. 26, (2000) pp. 9575-9582.

Chen et al., Achieving area-selective atomic layer deposition on patterned substrates by selective surface modification, Applied Physics Letters 86, 191910-1-191910-3 (2005).

Chou et al., Nanoimprint lithography, J.Vac. Sci. Technol. B 14(6), Nov./Dec. 1996, American Vacuum Society.

Park et al., Microcontact patterning of ruthenium gate electrodes by selective area atomic layer deposition, Applied Physics Letters 86, 051903 (2005).

Qin et al., On Wire Lithography, www.sciencemag.org, vol. 309, Jul. 1, 2005, p. 113-115.

Sinha et al., "Area-Selective ALD of Titanium Dioxide Using Lithographically Defind Poly (methyl methacrylate) Films, Journal of the Electrochemical Society, 153 (5) G465-G469 (2006).

Sony CX-News vol. 29, 2002, Next Generation Low-Cost Electron Beam Lithography Fabrication Technology, www.sony.net/Products/SC-HP/cx_news/vol29/pdf/mask.pdf.

Bates et al.; "Block Copolymers-Designer Soft Materials"; *Physics Today*; Feb. 1999, vol. 52, No. 2; pp. 32-38.

Bergeron, et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Black et al. "Nanometer-Scale Pattern Registration and Aignment by Directed Diblock Copolymer Self-Assembly," IEEE Transactions on Nanotechnology, vol. 3, No. 3 (Sep. 2004); pp. 412-415.

Black et al. "IBM demos new nanotechnology method to build chip components. Creates nanocrystal memory devices using self assembly technique compatible with conventional semiconductor processing," http://domino.research.ibm.com/comm/pr.nsf/pages/news.20031208_selfassembly.html; Dec. 8, 2003.

Callahan, Tim; "Pattern Formation"; Mathematics Department; www.math.lsa.umich.edu/~timcall/patterns/; Oct. 28, 2005; 5 pgs.

Carcia et al., "Thin films for Phase-shift Masks," *Vacuum and Thin Film*, IHS Publishing Group, 14-21 (Sep. 1999).

Cheng et al., "Fabrication of nanostructures with long-range order using block copolymer lithography," Applied Physics Letters, vol. 81, No. 19, pp. 3657-3659 (Nov. 4, 2002).

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Cochran, Eric W.; Chemical Engineering-Iowa State University; www.iastate.edu/~ch_e/faculty/cochran.htm; Oct. 28, 2005; 2 pgs.

"U.S. Appl. No. 11/543,515, filed Oct. 24, 2006, MICRON Ref. No. 2005-1173.00/US."

"U.S. Appl. No. 11/389,581, filed Mar. 23, 2006, MICRON Ref. No. 2005-0695.00/US."

"U.S. Appl. No. 11/445,907, filed Jun. 2, 2006, MICRON Ref. No. 2005-0865.00/US."

Edwards et al., "Precise Control over Molecular Dimensions of Block-Copolymer Domains Using the Interfacial Energy of Chemically Nanopatterned Substrates," *Advanced Materials*, 16, No. 15, (Aug. 4, 2004); pp. 1315-1319.

Ex Parte Cantell, unpublished decision of the Board of Patent Appeals and Interferences, Mar. 4, 2005.

Fasolka et al.; "Block Copolymer Thin Films: Physics and Applications"; Annu. Rev. Mater. Res. 2001.31:323-355.

Guarini et al., "Low voltage, scalable nanocrystal FLASH memory fabricated by templated self-assembly," Electron Devices Meeting 2003, IEDM 03 Technical Digest. *IEEE* International Dec. 8-10 2003, pp. 22.2.1-22.2.4.

Guarini et al.; "Optimization of Diblock Copolymer Thin Film Self Assembly"; Adv. Mater. 2002, 14, No. 1, Sep. 16; pp. 1290-1294.

Herr, Daniel J.C.; "The Extensibility of Optical Patterning Via Directed Self-Assembly of Nano-Engineered Imaging Materials"; Future Fab Intl.; www.future-fab.com; 8 pgs.; Oct. 27, 2005.

http://mrsec.uchicago.edu/Nuggets/Stripes/; Oct. 27, 2005; 3 pgs.

Jeong et al.; "Asymmetric Block Copolymers with Homopolymers: Routes to Multiple Length Scale Nanostructures"; Adv. Mater. 2002, 14, No. 4, Feb. 19; pp. 274-276.

Jeong et al.; "Volume Contractions Induced by Crosslinking: A Novel Route to Nanoporous Polymer Films"; Adv. Mater. 2003, 15, No. 15, Aug. 5; pp. 1247-1250.

Joubert et al., "Nanometer scale linewidth control during etching of polysilicon gates in high-density plasmas," Microelectronic Engineering 69 (2003), pp. 350-357.

Kim et al., "Epitaxial self-assembly of block copolymers on lithographically defined nanopatterned substrates," *Nature* 424, 411-414 (Jul. 24, 2003).

Limary et al.; "Block Copolymer Thin Films Above and Below the Order-Disorder Transition Temperature"; Mat.Res.Soc.Symp. vol. 629; (2000) Materials Research Society;6 pgs.

"Molecular Thermodynamics & Statistical Mechanics (MTSM) Research Group"; www.engr.wisc.edu/groups/mtsm/research.shtml; Oct. 28, 2005; 7 pgs.

Nealy et al, "Directed assembly of imaging layers for sub-30 nm lithography", *First International Nanotechnology Conference on Communication and Cooperation*, Jun. 2005, 2 pages.

Ngandu, K., "Resolution Enhancement Techniques for Optical Lithography," NNIN REU Research Accomplishments, 90-91 (2004).

Oehrlein et al., "Pattern transfer into low dielectic materials by high-density plasma etching," Solid State Tech., May 2000, 8 pages.

"Polymer Research Laboratory"; www.princeton.edu/~polymer/block.html; Oct. 27, 2005; 2 pgs.

Stoykovich et al., "Directed Assembly of Block Copolymer Blends into Nonregular Device-Oriented Structures," *Science*, vol. 308, 1442-1446 (Jun. 3, 2005).

Tirrell et al.; "Self-Assembly in Materials Synthesis"; MRS Bulletin; vol. 30; Oct. 2005; pp. 700-704.

Wang et al., "Symmetric diblock copolymer thin films confined between homogenous and patterned surfaces: Simulations and theory," *Journal of Chemical Physics* vol. 112, No. 22, (2000); pp. 9996-10010.

Zheng et al.; "Structural Evolution and Alignment of Cylinder-Forming PS-*b*-PEP Thin Films in Confinement Studied by Time-Lapse Atomic Force Microscopy"; Mater.Res.Soc.Symp.Proc. vol. 854E (2005) Materials Research Society; 4 pgs.

PCT International Search Report of Sep. 26, 2008, International Application No. PCT/US2008/063943, Filed: May 16, 2008.

Choi et al., "Sublithographic nanofabrication technology for nanocatalysts and DNA chips," *J.Vac. Sci. Technol.*, pp. 2951-2955 (Nov./Dec. 2003).

Park et al., "Enabling Nanotechnology with Self-Assembled Block Copolymer Patterns," *Polymer*, Elsevier Science Publishers, B.V., GB, vol. 44, No. 22 pp. 6725-6760 (Oct. 2003).

Rockford et al., "Polymers on Nanoperiodic, Heterogeneous Surfaces," *Physical Review Letters APS USA*, vol. 82, No. 12 (Mar. 22, 1999).

International Search Report (International Application No. PCT/US2007/011524).

* cited by examiner

PITCH MULTIPLICATION USING SELF-ASSEMBLING MATERIALS

REFERENCE TO RELATED APPLICATIONS

This application is related to U.S. patent application Ser. No. 11/389,581 to Gurtej Sandhu, filed Mar. 23, 2006, entitled Topography Directed Patterning and U.S. patent application Ser. No. 11/445,907 to Gurtej Sandhu, filed Jun. 2, 2006, entitled Topography Based Patterning The entire disclosure of each of these references is incorporated by reference herein.

BACKGROUND OF THE INVENTION

1. Field of the Invention

This invention relates to mask formation, including printing techniques for integrated circuit fabrication.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically includes millions of identical circuit elements, known as memory cells. A memory cell typically consists of two electrical devices: a storage capacitor and an access field effect transistor. Each memory cell is an addressable location that may store one bit (binary digit) of data. A bit may be written to a cell through the transistor and may be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM) or incorporate switches into the memory element (e.g., EEPROM for flash memory).

In another example, flash memory typically includes millions of flash memory cells containing floating gate field effect transistors that may retain a charge. The presence or absence of a charge in the floating gate determines the logic state of the memory cell. A bit may be written to a cell by injecting charge to or removing charge from a cell. Flash memory cells may be connected in different architecture configurations, each with different schemes for reading bits. In a "NOR" architecture configuration, each memory cell is coupled to a bit line and may be read individually. In a "NAND" architecture configuration, memory cells are aligned in a "string" of cells, and an entire bit line is activated to access data in one of the string of cells.

In general, by decreasing the sizes of the electrical devices that constitute a memory cell and the sizes of the conducting lines that access the memory cells, the memory devices may be made smaller. Additionally, storage capacities may be increased by fitting more memory cells on a given area in the memory devices. The need for reductions in feature sizes, however, is more generally applicable to integrated circuits, including general purpose and specialty processors.

The continual reduction in feature sizes places ever greater demands on the techniques used to form the features. For example, photolithography is commonly used to pattern these features. Typically, photolithography involves passing light through a reticle and focusing the light onto a photochemically-active photoresist material. Just as a slide has an image to be projected onto a screen, the reticle typically has a pattern to be transferred to a substrate. By directing light or radiation through the reticle, the pattern in the reticle may be focused on the photoresist. The light or radiation causes a chemical change in the illuminated parts of the photoresist, which allows those parts to be selectively retained or removed, depending upon whether positive or negative photoresist is used, relative to parts which were in the shadows. Thus, the exposed and unexposed parts form a pattern in the photoresist.

Because lithography is typically accomplished by projecting light or radiation onto a surface, the ultimate resolution of a particular lithography technique depends upon factors such as optics and light or radiation wavelength. For example, the ability to focus well-defined patterns onto resist depends upon the size of the features and on the wavelength of the radiation projected through the reticle. It will be appreciated that resolution decreases with increasing wavelength, due, among other things, to diffraction. Thus, shorter wavelength radiation is typically used to form well-resolved features, as the sizes of the features decrease.

In conjunction with radiation of a particular wavelength, photolithography utilizes photoresist compatible with that radiation. After being developed, the photoresist acts as a mask to transfer a pattern to an underlying material. The photoresist is sufficiently robust to withstand the development step without deforming and is also sufficiently robust to withstand an etch for transferring the mask pattern to an underlying material. As feature sizes decrease, however, the widths of the photoresist mask features also decrease, but typically without a corresponding decrease in the heights of these mask features. Due to the high aspect ratio of these mask features, it may be difficult to maintain the structural integrity of these thin mask features during the development and pattern transfer steps. As a result, the availability of sufficiently robust photoresist materials may limit the ability of photolithography to print features, as those features continue to decrease in size.

Accordingly, there is a continuing need for high resolution methods to pattern small features.

DETAILED DESCRIPTION OF SOME EMBODIMENTS

Figure 1:
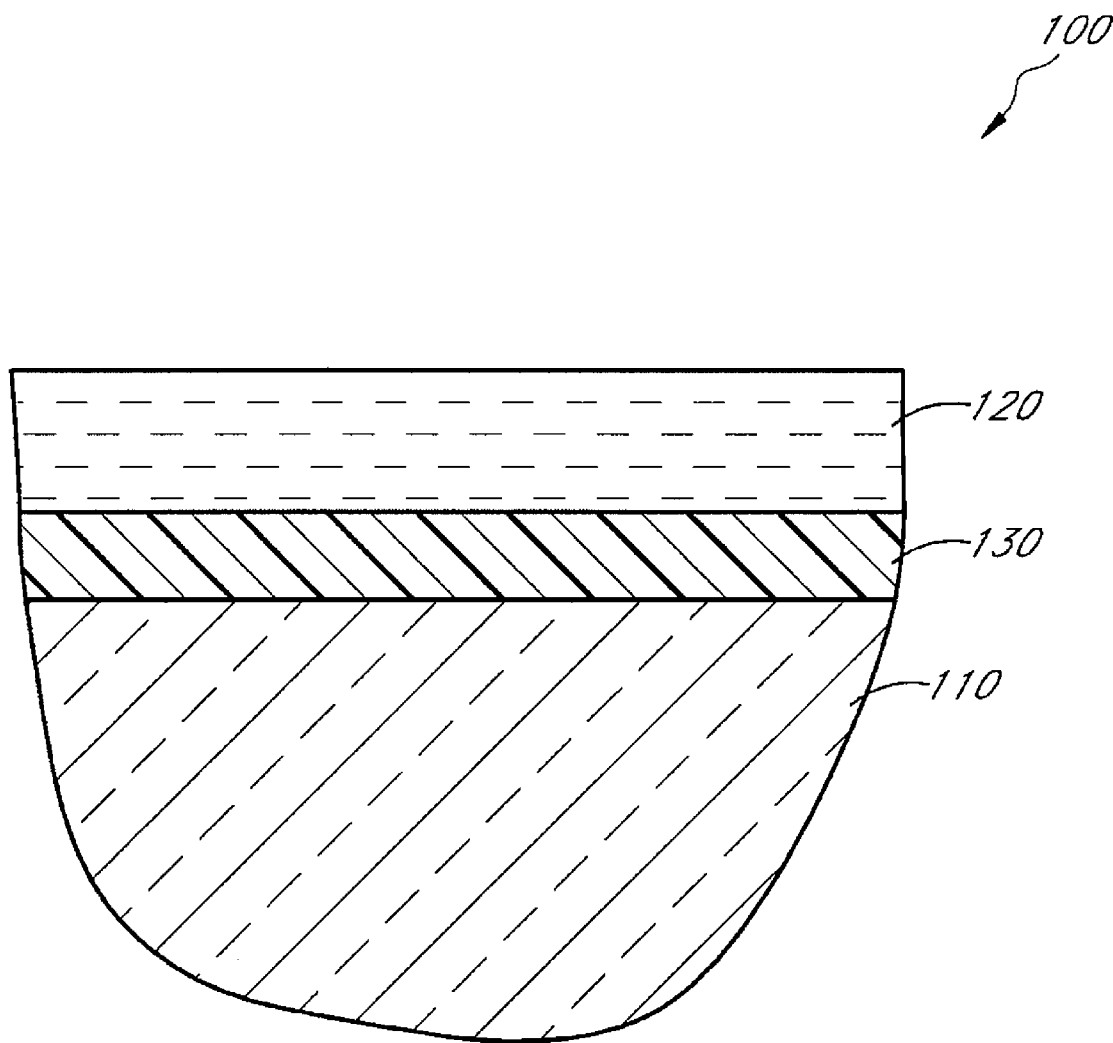
FIG. 1 is a schematic cross-sectional side view of a substrate with overlying masking layers, in accordance with some embodiments of the invention.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar and non-polar blocks, the blocks will segregate so that non-polar blocks aggregate with other non-polar blocks and polar blocks aggregate with other polar blocks. It will be appreciated that the block copolymers may be described as a self-organizing material since the blocks can move to form a pattern without active application of an external force to direct the movement of particular individual molecules, although heat may be applied to increase the rate of movement of the population of molecules as a whole.

In addition to interactions between the block species, the self-organization of block copolymers can be influenced by topographical features, such as steps on the surface on which the block copolymers are deposited. For example, a diblock copolymer, a copolymer formed of two different block species, may form alternating domains, or regions, which are each formed of a substantially different block species. When self-organization of block species occurs in the area between the walls of a step, the steps may interact with the blocks such that, e.g., each of the alternating regions formed by the blocks is made to form a regular pattern with features oriented parallel to the walls. In addition, the self-organization of block copolymers may be guided by photolithographically modifying a surface, without forming steps in the surface, as disclosed in: Stoykovich et al., Science 308, 1442 (2005); Kim et al., Nature 424, 411 (2003); and Edwards et al., Adv. Mater. 16, 1315 (2004). The entire disclosure of each to these references is incorporated by reference herein.

Such self-organization can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a copolymer mask are disclosed in U.S. patent application Ser. No. 11/389,581 to Gurtej Sandhu, filed Mar. 23, 2006, entitled Topography Directed Patterning, (Micron Ref. No.: 2005-0865); and U.S. patent application Ser. No. 11/445,907 to Gurtej Sandhu, filed Jun. 2, 2006, entitled Topography Based Patterning (Micron Ref. No.: 05-0865), the entire disclosure of each of which is incorporated by reference herein. While self-organizing materials may be used to form relatively small mask features, further decreases in the sizes of the mask features are desired due to the constant miniaturization of integrated circuits.

Moreover, the lengths of block copolymers may be an intrinsic limit to the sizes of domains formed by the blocks of those block copolymers. For example, the copolymers may be chosen with a length that facilitates self-assembly into a desired pattern of domains, and shorter copolymers may not self-assemble as desired.

Embodiments of the invention allow for the formation of features smaller than those that may be formed by block polymers alone. In embodiments of the invention, a self-organizing material formed of different chemical species is allowed to organize to form domains composed of like chemical species. Some of those domains are selectively removed to form mandrels, or temporary placeholders. A pitch multiplication process is then performed using the mandrels formed from the self-organizing material. Features with a pitch smaller than a pitch of the mandrels are derived from the mandrels. In some embodiments, spacers are formed on sidewalls of the mandrels and the mandrels are selectively removed. The spacers, or other mask features derived from the spacers, are used as part of a mask to pattern underlying materials, e.g., during the fabrication of integrated circuits.

Embodiments of the invention may form the mask features may be formed without using newer, relatively complex and expensive lithography techniques and the burden on the robustness of photoresist may be reduced. For example, rather than using relatively soft and structurally delicate photoresist in a mask, spacers or mask features derived from the spacers may be used as a mask. The use of spacers allows the selection of a variety of materials for the spacers, and the materials may be selected for robustness and compatibility with underlying materials used in a process flow. Moreover, because copolymer material is not used as a mask for patterning underlying layers, the copolymer materials may be selected without regard to, e.g., their robustness and suitability for forming masking layers. Rather, the copolymer material may be selected based upon their self-organizing behavior and suitability for use in mandrels, thereby increasing process latitude. Moreover, the self-organizing behavior of materials such as block copolymers allows the reliable formation of very small features, thereby facilitating the formation of a mask with a very small feature size. For example, features having a critical dimension of about 1 nm to about 100 nm, about 3 nm to about 50 nm or about 5 nm to about 30 may be formed.

Reference will now be made to the Figures, wherein like numerals refer to like parts throughout. It will be appreciated that the Figures are not necessarily drawn to scale.

In a first phase of methods according to some embodiments, a plurality of mandrels is formed from self-organizing material, such as block copolymers. FIGS. 1-8 illustrate a method for self-assembling the self-organizing material into a desired pattern using guides or step features to guide the self-assembly. In other embodiments, it will be appreciated that the self-assembly of the self-organizing material may be directed by any method known in the art.

With reference to FIG. 1, a cross-sectional side view of a partially formed integrated circuit 100 is illustrated. Masking layers 120, 130 may be provided above a substrate 110 to form guides for copolymer self-assembly. The materials for the layers 120, 130 overlying the substrate 110 are chosen based upon consideration of the interaction of the layers with block copolymer materials to be used and of the chemistry and process conditions for the various pattern forming and pattern transferring steps discussed herein. For example, because patterns in upper layers are transferred to lower layers, the lower masking layer 130 is chosen so that it can be selectively etched relative to at least some of the other exposed materials. It will be appreciated that a material is considered selectively, or preferentially, etched when the etch rate for that material is at least about 2-3 times greater, or at least about 10 times greater, or at least about 20 times greater, or at least about 50 times greater than that for surrounding materials.

It will be appreciated that the "substrate" to which patterns are transferred may include a single material, a plurality of layers of different materials, a layer or layers having regions of different materials or different structures in them, etc. These materials may include semiconductors, insulators, conductors, or combinations thereof. For example, the substrate may comprise doped polysilicon, a single crystal electrical device active area, a silicide, or a metal layer, such as a tungsten, aluminum or copper layer, or combinations thereof. In some embodiments, the mask features discussed below may directly correspond to the desired placement of conductive features, such as interconnects, in the substrate. In other embodiments, the substrate may be an insulator and the location of mask features may correspond to the desired location of insulation between conductive features, such as in damascene metallization. The mask features may be used as a hard mask to directly etch the substrate, or may be used to transfer a pattern to another underlying layer, e.g., a carbon layer, such as a transparent carbon, layer, which is then used to transfer the pattern to one or more underlying layers, such as the substrate.

With continued reference to FIG. 1, the selectively definable layer 120 overlies a hard mask, or etch stop, layer 130, which overlies the substrate 110. The selectively definable layer 120 may be photodefinable, e.g., formed of a photoresist, including any photoresist known in the art. For example, the photoresist may be any photoresist compatible with extreme ultraviolet systems (e.g., 13.4 nm wavelength systems), 157 nm, 193 nm, 248 nm or 365 nm wavelength systems, or 193 nm wavelength immersion systems. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are used with photolithography systems utilizing relatively short wavelength light, e.g., 193 nm. KrF photoresists are used with longer wavelength photolithography systems, such as 248 nm systems. In addition, while the use of self-organizing material and pitch multiplication in embodiments of the invention may obviate the need to define extremely small features with expensive, relatively new direct formation techniques such as extreme ultraviolet systems (including 13.4 nm wavelength systems) or electron beam lithographic systems, such systems may also be used, if desired. In addition, maskless lithography, or maskless photolithography, may be used to define the selectively definable layer 120. In other embodiments, the layer 120 and any subsequent resist layers may be formed of a resist that may be patterned by nano-imprint lithography, e.g., by using a mold or mechanical force to form a pattern in the resist.

The material for the hard mask layer 130 may comprise an inorganic material, which is not a polymer. Exemplary materials include silicon oxide ($SiO_2$), silicon nitride, silicon or a dielectric anti-reflective coating (DARC), such as a silicon-rich silicon oxynitride. The hard mask layer 130 comprises silicon nitride in the illustrated embodiment. The material for the hard mask layer 130 is selected to interact with the later-deposited self-organizing material to direct the self-assembly of the self-organizing material into a desired pattern.

Figure 2:
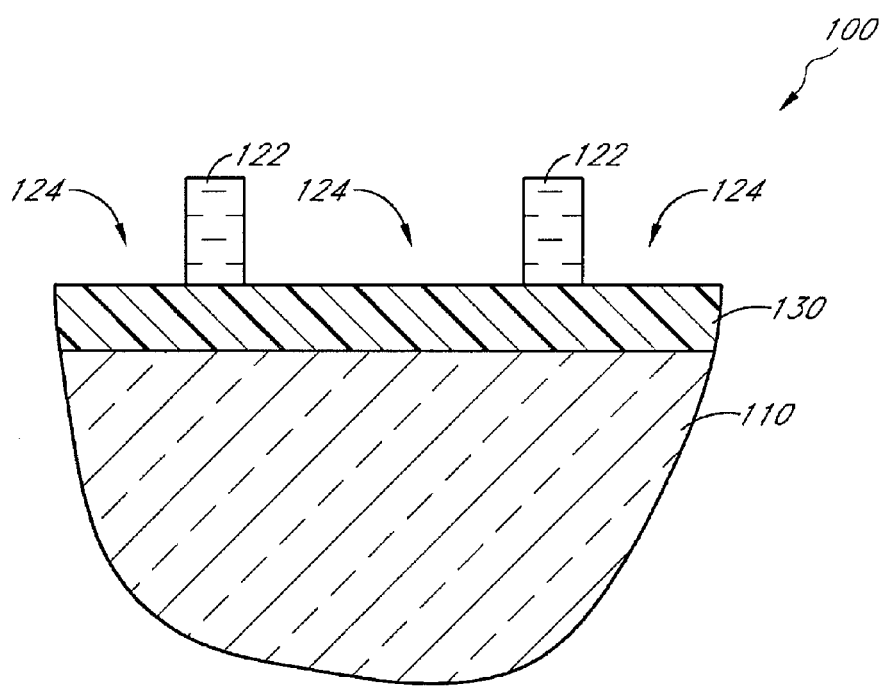
FIG. 2 is a schematic cross-sectional side view of the structure of FIG. 1 after patterning a selectively-definable layer, in accordance with some embodiments of the invention.

With reference to FIG. 2, the photodefinable layer 120 is exposed to radiation through a reticle and then developed to leave a pattern comprising features 122 which are formed of photodefinable material. It will be appreciated that the pitch of the resulting features 122, e.g., lines, is equal to the sum of the width of a line 122 and the width of a neighboring space 124. In some embodiments, the pitch of the features 122 may be, e.g., about 400 nm or less, about 300 nm or less, about 200 nm or less, or about 100 nm or less. In an exemplary embodiment, the features 122 may have a critical dimension of about 140 nm and a pitch of about 280 nm.

Figure 3:
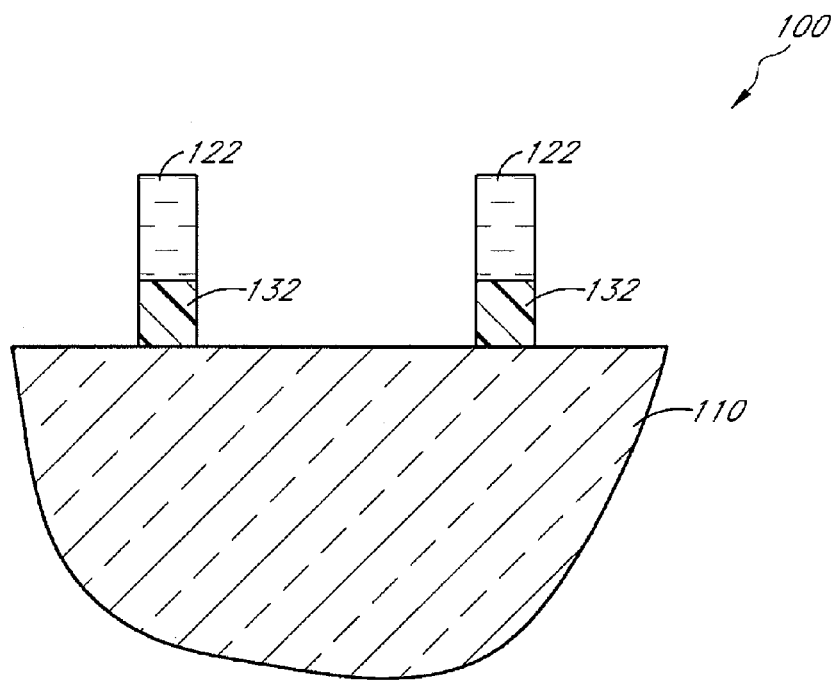
FIG. 3 is a schematic cross-sectional side view of the structure of FIG. 2 after etching through a hard mask layer, in accordance with embodiments of the invention.
Figure 4:
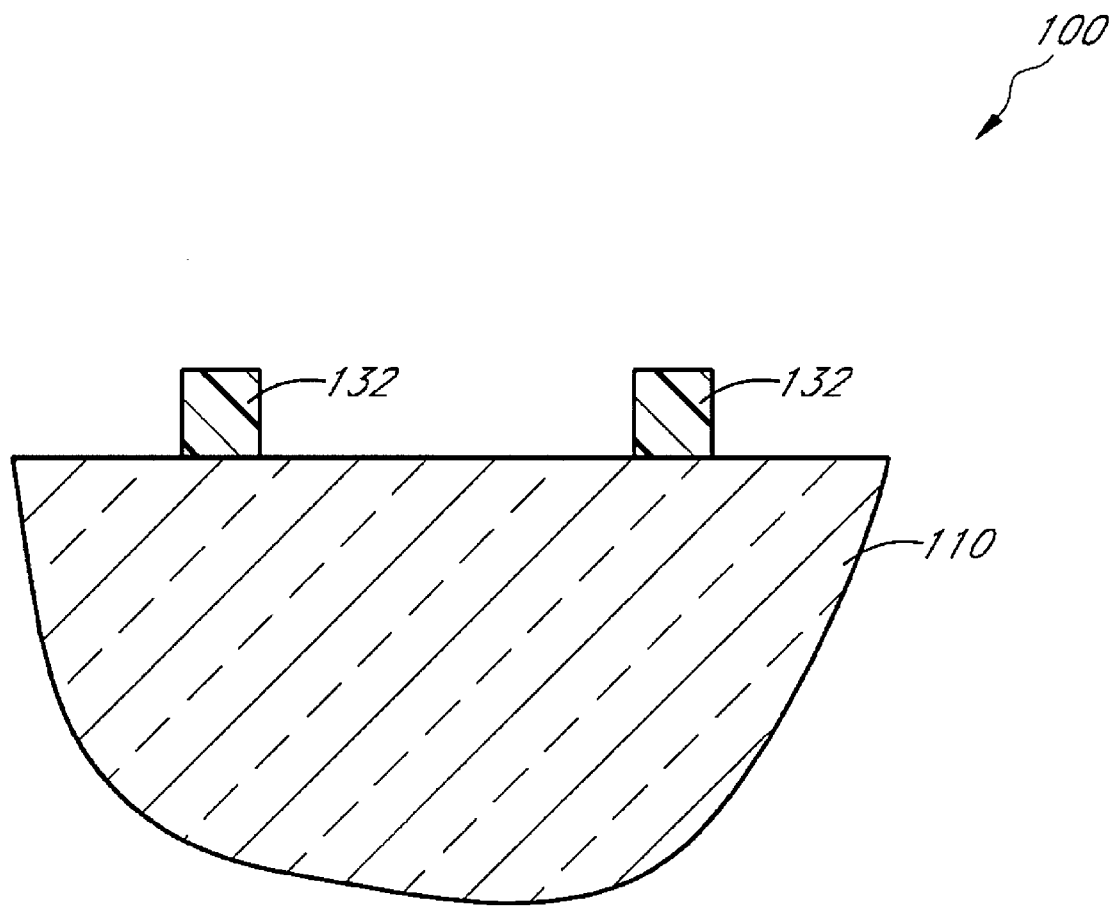
FIG. 4 is a schematic cross-sectional side view of the structure of FIG. 3 after removing the selectively-definable layer, in accordance with some embodiments of the invention.

With reference to FIG. 3, the pattern in the photodefinable layer 120 is transferred to the hard mask layer 130, thereby forming hard mask features 132 in the hard mask layer 130. The pattern transfer may be accomplished using an anisotropic etch, such as an etch using a fluorocarbon plasma, although a wet (isotropic) etch may also be suitable if the hard mask layer 130 is sufficiently thin. Exemplary fluorocarbon plasma etch chemistries include $CFH_3$, $CF_2H_2$, $CF_3H$ and $CF_4$/HBr. With reference to FIG. 4, resist forming the photodefinable layer 120 may also be removed, e.g., by plasma ashing.

Figure 5:
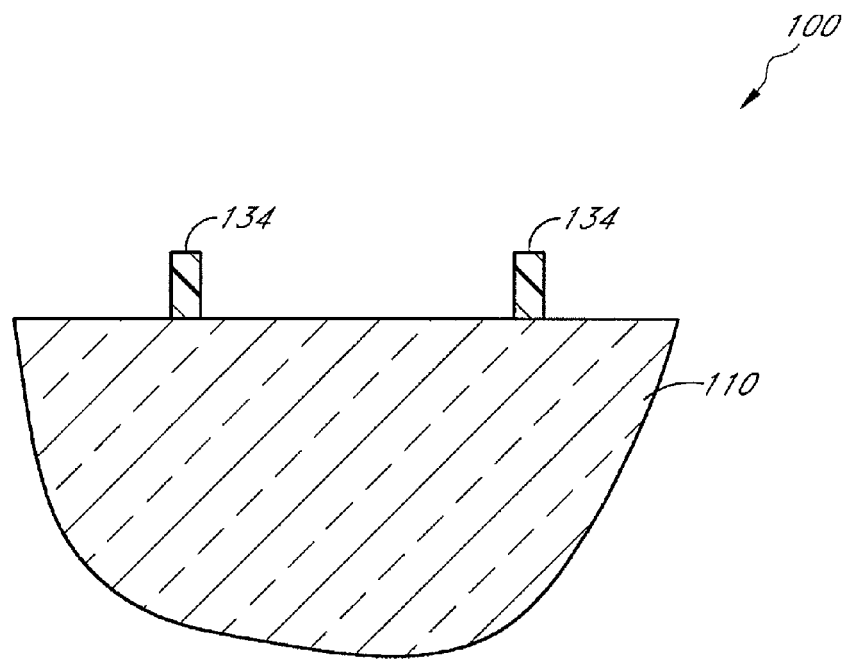
FIG. 5 is a schematic, cross-sectional side view of the structure of FIG. 4 after widening spaces between features in the hard mask layer, in accordance with some embodiments of the invention.

With reference to FIG. 5, the hard mask features 132 (FIG. 4) are trimmed to form guides 134 for copolymer self-assembly. The hard mask features 132 may be trimmed using a wet or dry etch which selectively etches the hard mask material relative to other exposed materials. The trim etch may be performed using, e.g., a $SO_2/O_2$/Ar plasma. The trim allows the formation of features having smaller critical dimensions than could easily be formed using conventional photolithography. For example, hard mask features 132 having a critical dimension of about 140 nm and a pitch of about 280 nm may be trimmed to form copolymer self-assembly guides 134 having a critical dimension of about 35 nm and the same pitch of about 280 nm. In other embodiments, the photoresist features 122 (FIG. 2) may be trimmed in addition to, or instead of, the hard mask features 132, thereby allowing guides 134 of the desired size to be formed without the need to trim the hard mask features 132.

A self-organizing material, e.g., block copolymers, is next applied and allowed to self-assemble to form a mask pattern over the substrate 110. Method for forming self-organized block copolymer patterns are disclosed in Block, IEE Transactions in Nanotechnology, Vol. 3, No. 3, September 2004 and in U.S. patent application Ser. Nos. 11/389,581 and 11/445,907, the entire disclosure of each of which is incorporated by reference herein.

Figure 6:
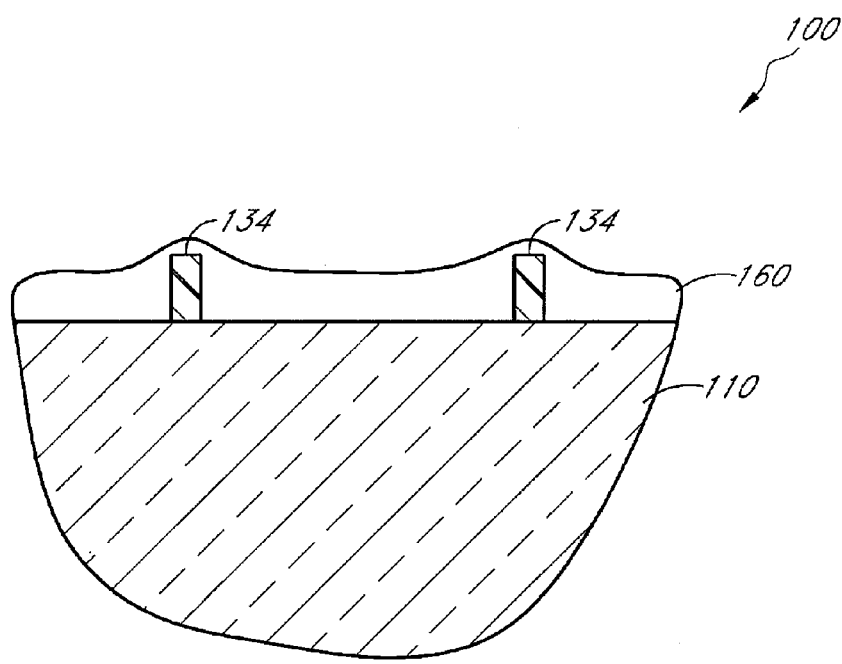
FIG. 6 is a schematic, cross-sectional side view of the structure of FIG. 5 after depositing a layer of a solution of self-organizing material, in accordance with some embodiments of the invention.
Figure 12:
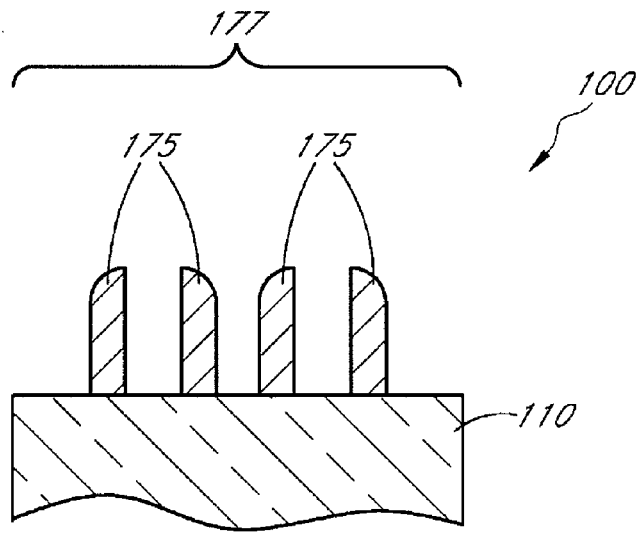
FIG. 12 is a schematic, cross-sectional side view of the structure of FIG. 11 after removing the mandrels to leave a pattern of free-standing spacers, in accordance with some embodiments of the invention.

With reference to FIG. 6, a film 160 of block copolymer material is deposited between and over the guides 134. The copolymer comprises blocks of polymer material which may be selectively etched relative to one another and which may self-organize in a desired and predictable manner, e.g., the blocks are immiscible and will segregate under appropriate conditions to form domains predominantly containing a single block species. In the exemplary illustrated embodiment, the copolymer is a diblock copolymer, comprising, e.g., polystyrene (PS) and poly-methylmethacrylate (PMMA). The diblock copolymers may be provided dissolved in a solvent, e.g., toluene. It will be appreciated that the total size of each diblock copolymer and the ratio of the constituent blocks and monomers may be chosen to facilitate self-organization and to form organized block domains having desired dimensions. For example, it will be appreciated that a block copolymer has an intrinsic polymer length scale, the average end-to-end length of the copolymer in film, including any coiling or kinking, which governs the size of the block domains. A copolymer solution having longer copolymers may be used to form larger domains and a copolymer solution having shorter copolymers may be used to form smaller domains. In some embodiments, the copolymers are selected to provide mandrels that provide a consistent spacing between spacers 175 (FIG. 12). In other embodiments, the block copolymers are selected to facilitate self-assembly into a desired pattern, the mandrels are trimmed, e.g., by a wet or dry etch, to provide a desired spacing between mandrels. The block copolymers may be deposited by various methods, including, e.g., spin-on coating, spin casting, brush coating or vapor deposition.

Figure 8:
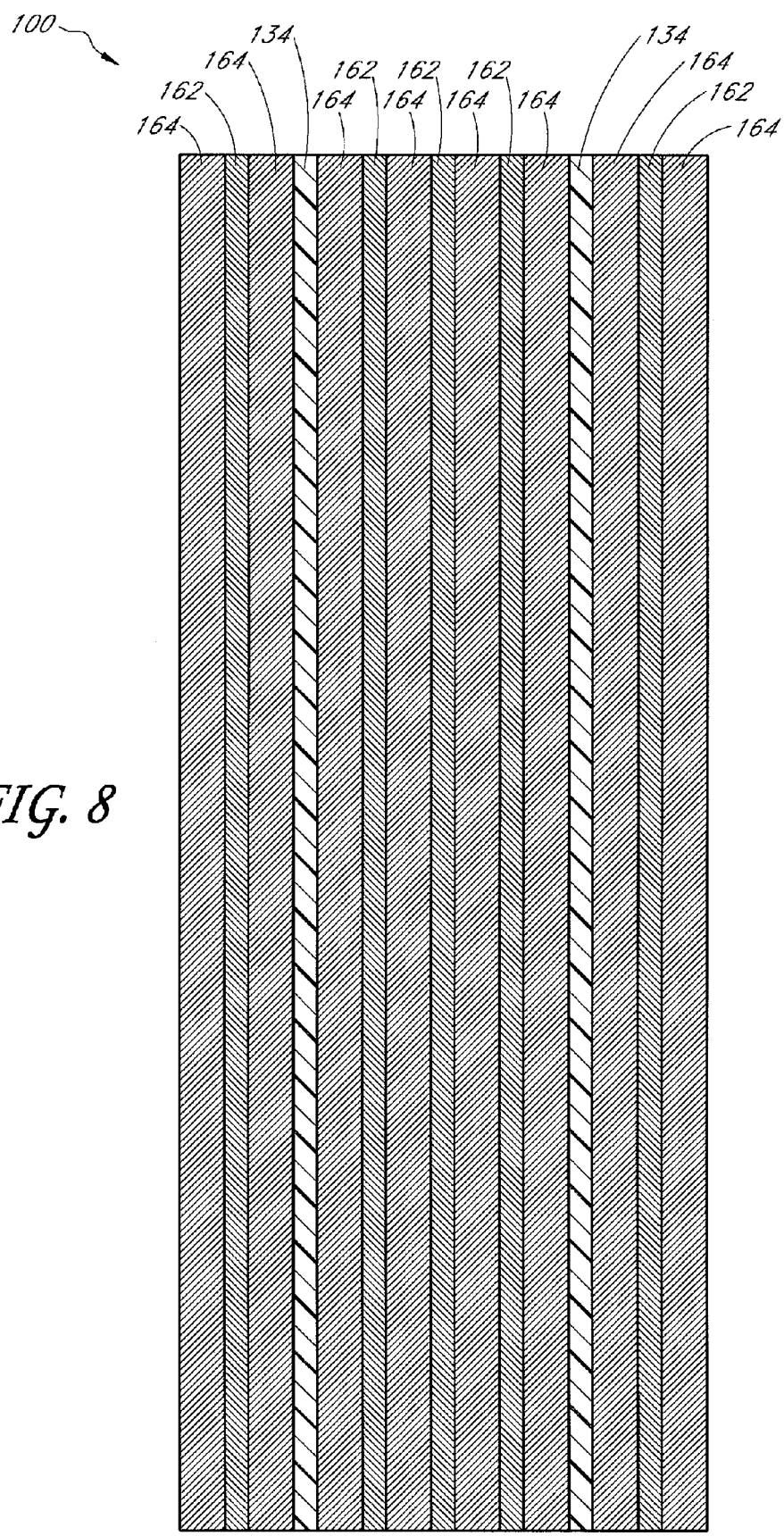
FIG. 8 is a schematic, top plan view of the structure of FIG. 7 showing an arrangement of domains of material resulting from the self-assembly of the self-organizing material, in accordance with some embodiments of the invention.

The thickness of the copolymer film 160 may be chosen based upon the desired pattern to be formed by the copolymers. It will be appreciated that, up to a particular thickness related to the polymer length scale and the environment in which the polymers are disposed, e.g., the distance between and the height of the guides 134, the copolymers will typically orient to form alternating, substantially lamellar domains that form parallel lines, as viewed in a top-down view (FIG. 8). Such lamellae may be used to pattern, e.g., interconnects, or the lateral extension of the lamellae may be limited to form isolated features, e.g., transistor gates. Under some conditions, related to the thickness of the film 160, the polymer length scale and the environment in which the polymers are disposed, the copolymers may orient to form vertically-extending pillars, such as cylinders, or spheres.

For forming lamellae, the copolymer film thickness may be less than about the length scale of the copolymers forming the film. For example, where the copolymer length scale is about 35 nm, the thickness of the films is about 35 nm or less, about 30 nm or less, or about 25 nm or less.

It will be appreciated that the thickness of the film 160 may be greater than, equal to or less than the height of the guides 134. As illustrated and discussed further below, a thickness which is greater than the height of the guides 134 may be used to provide a copolymer reservoir. In other embodiments, a thickness which is equal to, or less than the height of the guides 134 may be used to form isolated islands of copolymers between the guides 134, thereby preventing cross-diffusion of copolymers between the islands.

While the invention is not bound by theory, it will be appreciated that the different block species are understood to self-aggregate due to thermodynamic considerations in a process similar to the phase separation of materials. The self-organization is guided by the guides 134, which encourage the constituent blocks of the block copolymers to orient themselves along the length of the guides 134 due to interfacial interactions. It will be appreciated that the self-organization may result in a more efficient packing of the copolymer species. As a result, in some cases, the free copolymers available for the self-organization may be depleted if the copolymer film 160 extends over too large of an expanse, causing an area in the middle of the expanse to be formed without organized copolymers or with poorly organized copolymers. Thus, in some embodiments, the copolymer film 160 is sufficiently thick to extend above the guides 134 to provide a reservoir of copolymers for the self-organization which occurs between the guides 134. In addition, the distance between the guides 134 may be chosen to be sufficiently small to minimize the depletion effect that may occur over large expanses.

Figure 7:
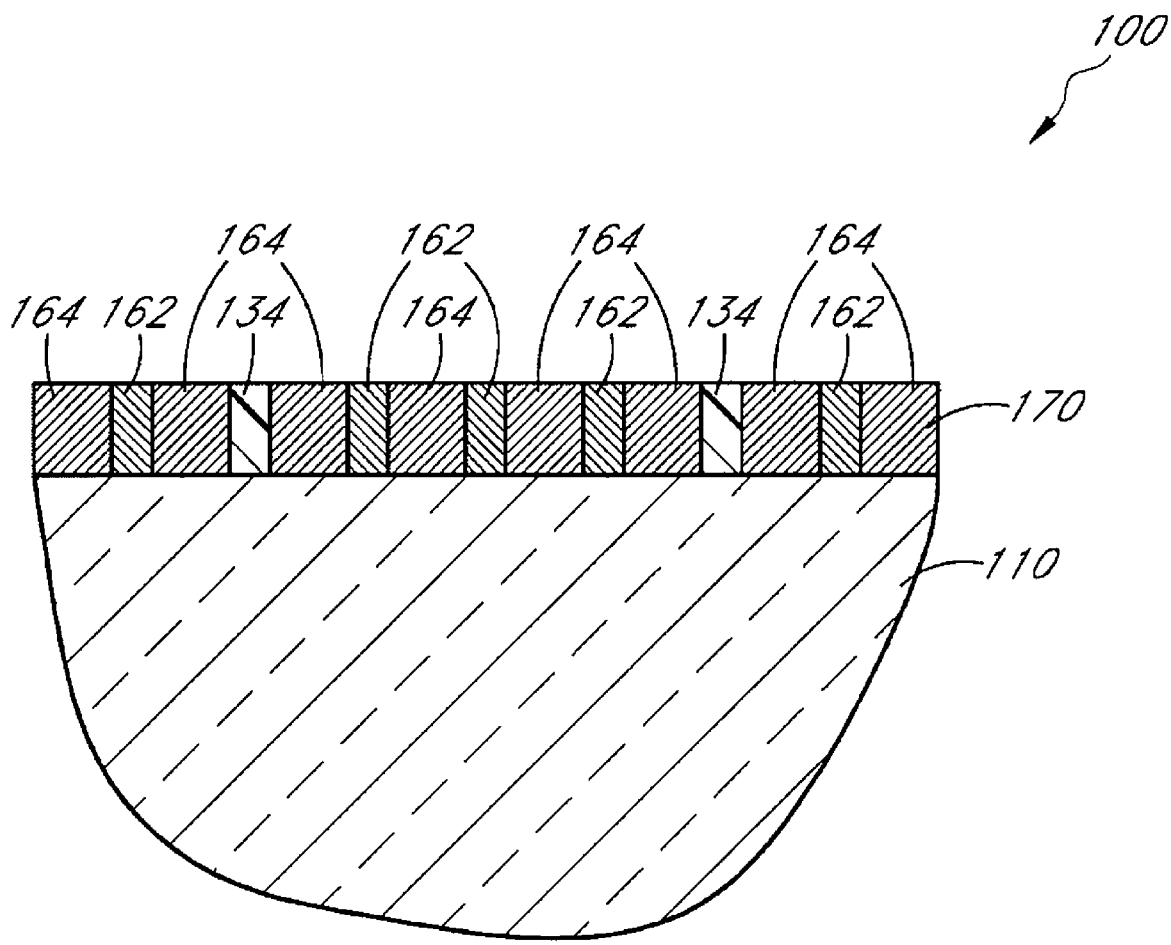
FIG. 7 is a schematic, cross-sectional side view of the structure of FIG. 6 after self-assembly of the self-organizing material, in accordance with some embodiments of the invention.

With reference to FIG. 7, the block copolymers in the copolymer film 160 are allowed to self-organize. The self-organization may be facilitated and accelerated by annealing the partially-fabricated integrated circuit 100. The temperature of the anneal may be chosen to be sufficiently low to prevent adversely affecting the block copolymers or the partially fabricated integrated circuit 100. The anneal may be performed at a temperature of less than about 250° C., less than about 200° C. or about 180° C. in some embodiments. The anneal may also be used to cause cross-linking of the copolymers, thereby stabilizing the copolymers for later etching and pattern transfer steps.

A pattern of lamellae resulting after the anneal is shown in FIG. 7. Domains 162 of one block species, e.g., PS, and domains 164 of the other block species, e.g., PMMA, alternate between the guides 134. It will be appreciated that the sizes of the block domains are determined by the sizes of the block species forming them.

With reference to FIG. 8, a top-down view of the partially fabricated integrated circuit of FIG. 7 is shown. The PS domains 162 can be seen alternating with the PMMA domains 164. Both domains 162 and 164 extend along the length of the guides 134.

Figure 9:
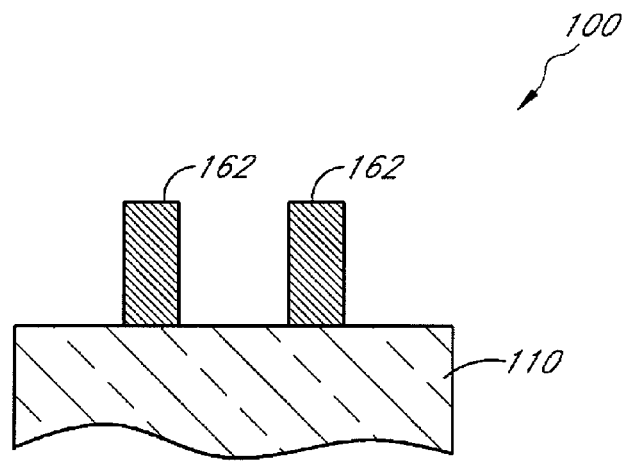
FIG. 9 is a schematic, cross-sectional side view of the structure of FIG. 7 after selectively removing some domains of self-organizing material to form mandrels, in accordance with some embodiments of the invention.

With reference to FIG. 9, the domains 164 are selectively removed, leaving behind the domain 162 and the guides 134 (not shown), which can function as mandrels for pitch multiplication. It will be appreciated that the domains 164 may be removed in a single step using a single etch chemistry or may be removed using multiple etches with different etch chemistries. For example, where the domains 164 are formed of PMMA and the domains 162 are formed of PS, the domains 164 may be removed by performing a selective wet etch, e.g., using acetic acid as an etchant. In other embodiments, a dry or anisotropic etch may be appropriate where one of the domains may be etched at a faster rate than the other. It will be appreciated that the dimensions of the resulting features may vary, depending on the size of the copolymer used and process conditions. In some embodiments, the resulting pattern may comprise PS domains having a critical dimension of about 50 nm to about 2 nm, about 35 nm or less to about 3 nm, with a pitch of about 100 nm to about 4 nm, or about 70 nm to about 6 nm. It will be appreciated that in other embodiments, the domains 162 and/or the guides 134 may be removed instead, thereby leaving the domains 164, with or without the guides 134.

Figure 10:
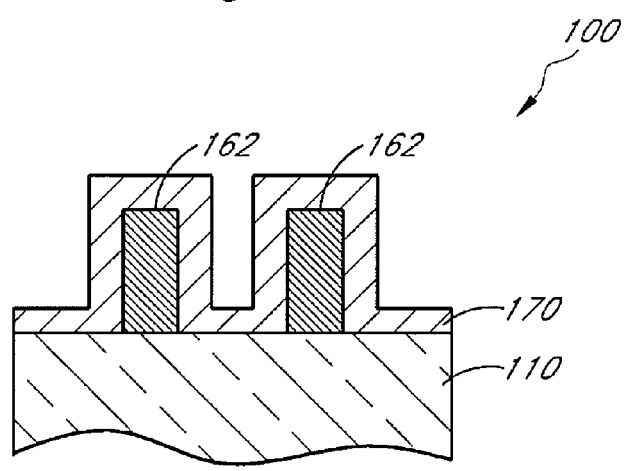
FIG. 10 is a schematic, cross-sectional side view of the structure of FIG. 9 after depositing a layer of a spacer material, in accordance with some embodiments of the invention.

Next, with reference to FIG. 10, a layer 170 of spacer material is blanket deposited conformally over exposed surfaces, including the substrate 110. The spacer material may be any material that may act as a mask for transferring a pattern to an underlying material. The spacer material: 1) may be deposited with good step coverage; 2) may be deposited at a temperature compatible with the mandrels 162; and 3) may be selectively etched relative to the mandrels 162 and guides 134, if present, and the underlying substrate 110. The spacer material may be, without limitation, an inorganic material, such as a silicon-containing material, or an organic material, such as a polymer. The silicon-containing spacer materials may be, without limitation, silicon, silicon oxide and silicon nitride. In the illustrated embodiment, the spacer material is silicon oxide.

Methods for spacer material deposition include atomic layer deposition, e.g., using a self-limiting deposition with a silicon precursor and a subsequent exposure to an oxygen or nitrogen precursor to form silicon oxides and nitrides, respectively. ALD may be performed at relatively low temperatures, e.g., under about 200° C. or under about 100° C., which may prevent thermal damage to underlying thermally sensitive materials. For example, ALD may be used to prevent damage to the polymer material forming the block domains 162. In other embodiments, chemical vapor deposition is used to deposit the spacer material.

The thickness of the layer 170 is determined based upon the desired width of the spacers 175 (FIG. 12). For example, in some embodiments, the layer 170 is deposited to a thickness of about 10-80 nm or about 20-50 nm to form spacers of roughly similar widths. The step coverage is about 80% or greater and or about 90% or greater.

Figure 11:
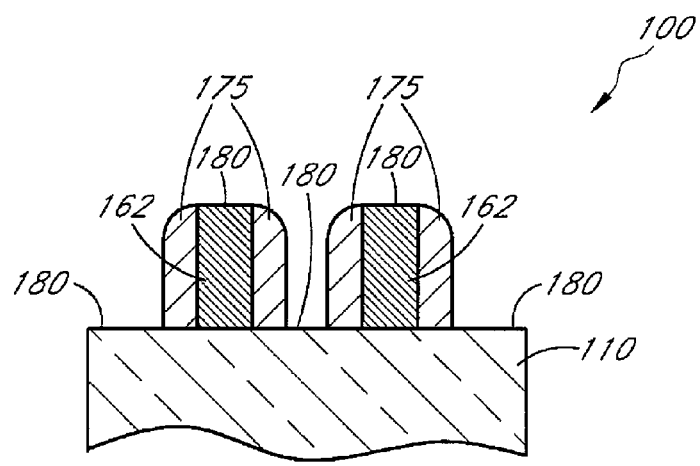
FIG. 11 is a schematic, cross-sectional side view of the structure of FIG. 10 after a spacer etch, in accordance with some embodiments of the invention.

With reference to FIG. 11, the silicon oxide spacer layer 170 is then subjected to an anisotropic etch to remove spacer material from horizontal surfaces 180 of the partially formed integrated circuit 100. Such an etch, also known as a spacer etch, may be performed using a fluorocarbon plasma, e.g., a $CF_4$, $CHF_3$ and/or $NF_3$ containing plasma.

With reference to FIG. 12, the block domains 162 and any remaining guides 134 are removed to leave freestanding spacers 175. The block domains 162 and guides 134 may be removed by wet or dry etches that selectively remove those features relative to the spacers 175. The etches may also selectively remove the block domains 162 and guides 134 relative to the underlying substrate 110. Depending upon the material forming the block domains 162 and the guides 134, the same or different etch chemistries may be applied. Etch chemistries include, without limitation, a $O_2$-based carbon trip etch to remove the PS block domains 162 and a phosphoric acid based wet etch to remove the silicon nitride guides 134.

Thus, pitch-multiplied mask features have been formed. In the illustrated embodiment, the pitch of the spacers 175 is roughly half that of the block domains 162 (FIG. 9) formed by the block copolymers. For example, where the block domains 162 had a pitch of about 200 nm, spacers 175 having a pitch of about 100 nm or less may be formed and where the block domains 162 had a pitch of about 60 nm or less, spacers 175 having a pitch of about 30 nm or less may be formed. It will be appreciated that because the spacers 175 are formed on the sidewalls of the block domains 162, the spacers 175 generally follow the outline of the block domains 162 and, so, typically form a closed loop. The spacers 175 form a first pattern 177. It will be appreciated that higher orders of pitch multiplication can be achieved in some embodiments by using the spacers 175 as mandrels to form other spacers or mask features.

Figure 13:
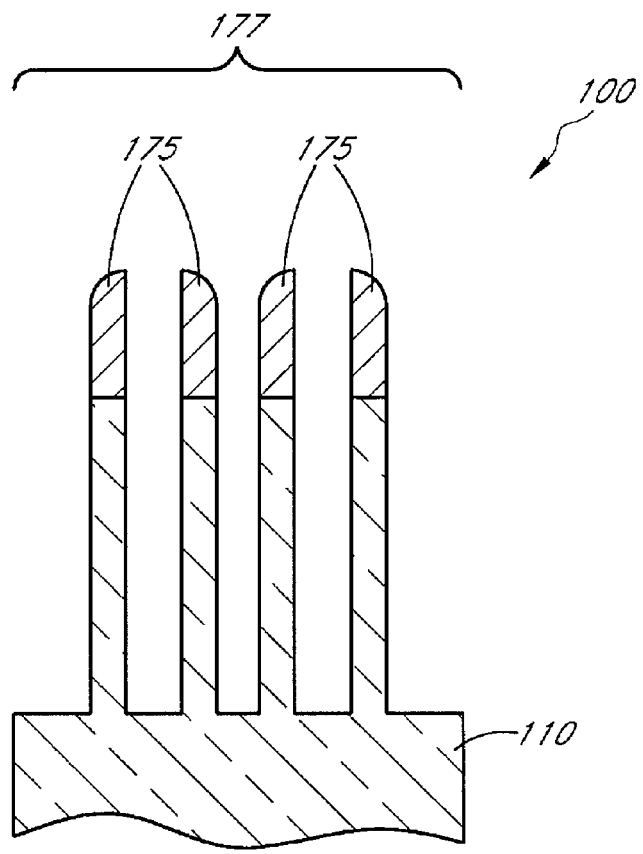
FIG. 13 is a schematic, cross-sectional side view of the structure of FIG. 12 after transferring a pattern formed by the freestanding spacers to an underlying substrate, in accordance with some embodiments of the invention.

With reference to FIG. 13, the pattern 177 is transferred to the substrate 110. The pattern transfer may be accomplished using etch chemistries appropriate for selectively etching the material or materials of the substrate 110 relative to the spacers 175. The skilled artisan can readily determine suitable etch chemistries for substrate materials. It will be appreciated that where the substrate 110 comprises layers of different materials, a succession of different chemistries, e.g., dry-etch chemistries, may be used to successively etch through these different layers, if a single chemistry is not sufficient to etch all the different materials. It will also be appreciated that, depending upon the chemistry or chemistries used, the spacers 175 may be etched. In the illustrated embodiment, the spacers 175 are sufficiently tall to complete the etch of the substrate 110 without being completely worn away.

Figure 14:
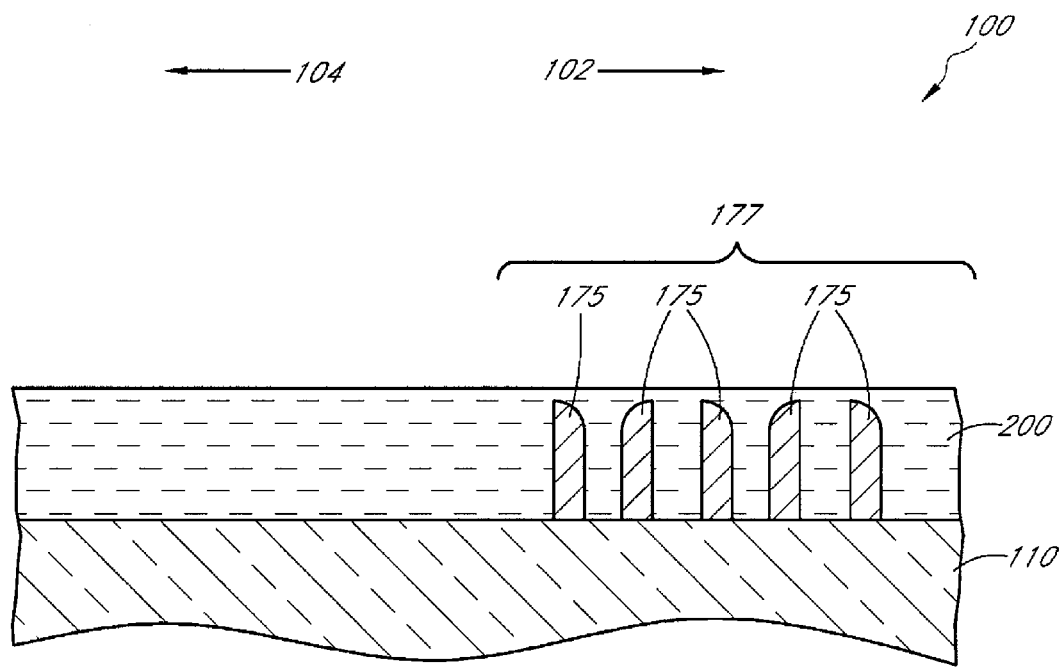
FIG. 14 is a schematic, cross-sectional side view of the structure of FIG. 12 after depositing a planarizing layer over the spacers, in accordance with some embodiments of the invention.

With reference to FIG. 14, the mask overlying the substrate 110, including the domain 162 and the guides 134, are stripped, leaving the patterned substrate 110. After the pattern transfer, the partially fabricated integrated circuit 100 is subjected to subsequent processing steps, including forming ancillary electrical devices and electrical interconnects, to form a completed integrated circuit, e.g., a memory chip.

It will be appreciated that various modifications of the illustrated embodiments are possible. For example, while discussed in the context of diblock copolymers for ease of illustration and discussion, the copolymers may be formed of two or more block species. In addition, while the block species of the illustrated embodiment are each formed of a different monomer, the block species may share monomer(s). For example, the block species may be formed of different sets of monomers, some of which are the same, or may be formed of the same monomer, but in a different distribution in each block. The different sets of monomers form blocks having different properties which may drive the self-assembly of the copolymers.

In some embodiments, a supplemental layer 180 of self-organizing material may be deposited over the block domains 162 and 164 and guides 134, to vertically extend the pattern defined by those block domains and the guides 134. The self-organizing material forming the supplement layer 180 may be a copolymer, such as a block copolymer. The material forming the supplemental layer 180 is chosen to interact with the block domains 162 and 164 and guides 134 such that the domains 162, 164 and the guides 134 are able to direct the organization of the self-organizing material. For example, where the block domains 162 and 164 and guides 134 include polar and non-polar block species, the layer 180 may also have polar and non-polar block species. In some embodiments, supplemental block copolymers forming the layer 180 are the same as the block copolymers of the film 160. A method for vertically extending a pattern formed of self-organizing material is disclosed in U.S. patent application Ser. No. 11/445,907 to Gurtej Sandhu, filed Jun. 2, 2006, entitled Topography Based Patterning, the entire disclose of which is incorporated herein by reference.

Figure 15:
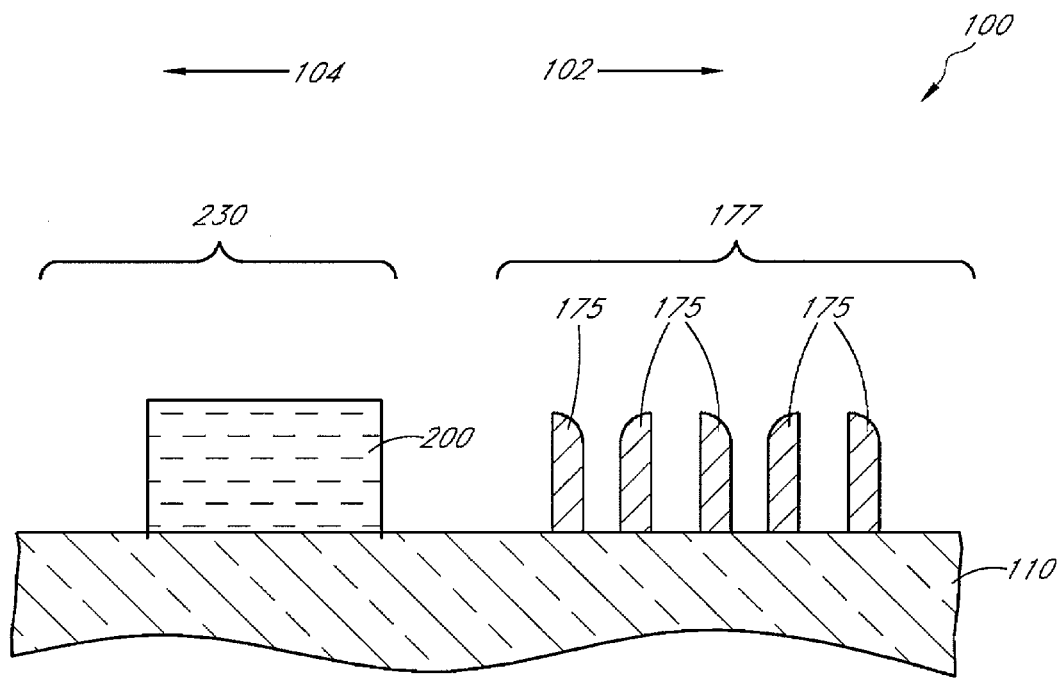
FIG. 15 is a schematic, cross-sectional side view of the structure of FIG. 14 after patterning the planarizing layer, in accordance with some embodiments of the invention.

It will be appreciated that, before or after transferring the mask pattern 177 to the substrate 110, additional mask patterns can be overlaid the mask pattern 177 (FIG. 11). For example, a planarizing material can be deposited between and over the spacers 175 and the planarizing material can be patterned to form an additional pattern. The additional pattern, forming a combined pattern with the mask pattern 177, can be transferred to the underlying substrate 110. With reference to FIG. 15, the planarizing material can be photoresist, such as negative or positive photoresist. With reference to FIG. 16, the photoresist can be patterned by exposure to radiation to form the additional pattern. Negative photoresist can be used in embodiments in which the features of the mask pattern 177 are very closely spaced, e.g., having a pitch of about 40 nm or less. It has been found that positive photoresist can be difficult to remove between spacers with such small pitches, due to difficulties in completely exposing the photoresist to light. On the other hand increasing the light intensity may undesirably cause polymerization of the photoresist, due to optical amplification by some transparent spacer materials, such as silicon oxide. Negative photoresist does not need to be exposed to light for removal, thereby facilitating the removal of photoresist between spacers and the formation of clean patterns in combination with the mask pattern 177.

In some embodiments, the hard mask layer 130 overlying the substrate may be omitted. For example, the photodefinable material may be formed of or replaced by a material which is compatible with the temperatures and other conditions for copolymer self-organization and/or the spacers 175 may be used as a mask for etching the substrate 110 where an etch having sufficient selectivity for the substrate 110 is available.

In some other embodiments, additional masking levels may be provided over the substrate 110. For example, additional hard mask layers can be provided between the spacers 175 and the substrate 110. The pattern 177 may be transferred to one or more additional hard mask layers before being transferred to the substrate 110. The additional hard mask layers may be selected to provide higher resistance to etches used for etching the substrate. For example, the pattern 177 may be transferred to an amorphous carbon layer before being transferred to the substrate 110. Amorphous carbon has been found to be suitable as a hard mask for etching a variety of silicon-containing materials.

Also, while "processing" through a mask layer may encompass etching an underlying layer, processing through the mask layers may involve subjecting layers underlying the mask layers to any semiconductor fabrication process. For example, processing may involve ion implantation, diffusion doping, depositing, oxidizing (particularly with use of a hard mask under the polymer mask), nitridizing, etc. through the mask layers and onto underlying layers. In addition, the mask layers may be used as a stop or barrier for chemical mechanical polishing (CMP) or CMP may be performed on any of the layers to allow for both planarization and etching of the underlying layers, as discussed in U.S. patent application Ser. No. 11/216,477, filed Aug. 31, 2005, the entire disclosure of which is incorporated by reference herein.

In addition, while the illustrated embodiments may be applied to fabricate integrated circuits, embodiments of the invention may be applied in various other applications where the formation of patterns with very small features is desired. For example, embodiments of the invention may be applied to form gratings, disk drives, storage media or templates or masks for other lithography techniques, including X-ray or imprint lithography. For example, phase shift photomasks may be formed by patterning a substrate that has a film stack having phase shifting material coatings.

Consequently, it will be appreciated from the description herein that the invention includes various embodiments. For example, according to some embodiments of the invention, a method for patterning a semiconductor substrate is provided. The method comprises providing a layer comprising block copolymers. One block of the block copolymers is selectively removed to leave laterally separated mandrels comprising an other block of the block copolymers. Spacer material is blanket depositing on the mandrels. The spacer material is etched to form spacers on sidewalls of the mandrels. A pattern defined by the spacers is transferred to the substrate.

According to other embodiments the invention, a method for forming a mask for patterning a substrate is provided. The method comprises providing a layer of a self-organizing material. Like chemical species of the self-organizing material are aggregated to form a repeating pattern having domains defined by the chemical species. One of the chemical species is preferentially removed to form spaced apart mandrels Spacers are formed on sidewalls of the mandrels.

According to yet other embodiments of the invention, a method for integrated circuit fabrication is provided. The method comprises exposing a block copolymer layer to a wet etch to define free-standing, regularly-spaced, spaced-apart placeholders in the block copolymer layer. Spacers are formed on sidewalls of the placeholders. A pattern derived from the spacers is transferred to an underlying substrate.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. A method for patterning a semiconductor substrate, comprising:
   providing a layer comprising block copolymers;
   selectively removing one block of the block copolymers to leave laterally-separated mandrels comprising an other block of the block copolymers;
   blanket depositing spacer material on the mandrels;
   etching the spacer material to form spacers on sidewalls of the mandrels; and
   transferring a pattern defined by the spacers to the substrate.

2. The method of claim 1, wherein providing the layer formed of block copolymers comprises:
   depositing a block copolymer solution over the substrate; and
   segregating blocks constituting the block copolymers to form a repeating pattern defined by blocks of the copolymers over the substrate.

3. The method of claim 2, wherein providing the layer formed of block copolymers further comprises providing laterally spaced apart copolymer self-assembly guides over the substrate, wherein depositing the block copolymer solution comprises depositing the block copolymer solution between the copolymer segregation guides.

4. The method of claim 3, wherein depositing the block copolymer solution between the copolymer segregation guides comprises forming a block copolymer reservoir directly over the guides.

5. The method of claim 3, wherein the guides are formed of a material which attracts or repels a block forming the block copolymers.

6. The method of claim 3, wherein the guides are formed of a material selected from the group consisting of silicon oxide, silicon and a dielectric anti-reflective coating.

7. The method of claim 1, further comprising removing the mandrels before transferring the pattern defined by the spacers to the substrate.

8. The method of claim 7, further comprising transferring the pattern defined by the spacers to an underlying hard mask layer before transferring the pattern defined by the spacers to the substrate.

9. The method of claim 8, wherein the hard mask layer comprises amorphous carbon.

10. The method of claim 1, further comprising:
    depositing a selectively-definable material over the spacers; and
    defining an other pattern in the selectively-definable material, wherein transferring the pattern defined by the spacers to the substrate comprises transferring a combined pattern formed from the pattern and the other pattern to the substrate.

11. The method of claim 10, wherein the selectively-definable layer is deposited on and between the spacers.

12. The method of claim 11, wherein the selectively-definable layer is photoresist.

13. The method of claim 12, wherein the photoresist is negative photoresist.

14. The method of claim 10, further comprising transferring the combined pattern formed from the pattern and the other pattern to an underlying hard mask layer before transferring the combine pattern to the substrate.

15. The method of claim 10, wherein transferring the combined pattern to the substrate transfers the pattern defined by the spacers to an array region of a partially-fabricated integrated circuit and transfers the other pattern to a periphery region of the partially-fabricated integrated circuit.

16. The method of claim 1, wherein transferring the pattern defined by the spacers to the substrate defines interconnects in the substrate.

17. A method for forming a mask for patterning a substrate, comprising:
    providing a layer of a self-organizing material;
    aggregating like chemical species of the self-organizing material to form a repeating pattern having domains defined by the chemical species;
    preferentially removing one of the chemical species to form spaced apart mandrels; and
    forming spacers on sidewalls of the mandrels.

18. The method of claim 17, wherein the self-organizing material comprises a block copolymer.

19. The method of claim 18 wherein the block copolymer is a diblock copolymer.

20. The method of claim 19, wherein the diblock copolymer comprises polystyrene.

21. The method of claim 20, wherein the diblock copolymer further comprises polymethylmethacrylate.

22. The method of claim 17, further comprising extending a height of the repeating pattern defined by the chemical species.

23. The method of claim 22, wherein extending the height of the repeating pattern defined by the chemical species comprises:
    depositing additional self-organizing material over the repeating pattern defined by the chemical species; and
    aligning like chemical moieties of the additional self-organizing material with the domains defined by the chemical species.

24. The method of claim 23, wherein the self-organizing material and the additional self-organizing material are block copolymers.

25. The method of claim 24, wherein the self-organizing material and the additional self-organizing material are a same block copolymers.

26. The method of claim 23, wherein preferentially removing one of the chemical species comprises etching like chemical moieties of the additional self-organizing material and etching one of the chemical species.

27. A method for integrated circuit fabrication, comprising:
    exposing a block copolymer layer to a wet etch to define free-standing, regularly-spaced, spaced-apart placeholders in the block copolymer layer;
    forming spacers on sidewalls of the placeholders; and
    transferring a pattern derived from the spacers to an underlying substrate.

28. The method of claim 27, wherein the wet etch comprises acetic acid.

29. The method of claim 28, wherein the block copolymer comprises blocks of polystyrene and polymethylmethacrylate.

30. The method of claim 27, wherein the placeholders have a pitch of about 100 nm or less.

31. The method of claim 30, wherein the placeholders have a pitch of about 50 nm or less.

32. The method of claim 27, wherein the free-standing, spaced-apart placeholders comprise vertical lamellae.

33. The method of claim 27, wherein the free-standing, spaced-apart placeholders comprise vertically extending isolated pillars.

34. The method of claim 27, wherein the transferring the pattern comprises defining regularly spaced features in an array region of a partially fabricated intergrated circuit.

35. The method of claim 27, wherein forming spacers comprises:
    blanket depositing a layer of spacer material over the placeholders; and
    anisotropically etching the layer of spacer material.

36. The method of claim 27, further comprising, before exposing the block copolymer layer to the wet etch:
    depositing a solution of block copolymers over the substrate; and
    annealing the block copolymer solution to cause self-assembly of the block copolymers into regularly-spaced block domains.

* * * * *

UNITED STATES PATENT AND TRADEMARK OFFICE
CERTIFICATE OF CORRECTION

PATENT NO.        : 7,923,373 B2                                   Page 1 of 1
APPLICATION NO.   : 11/757846
DATED             : April 12, 2011
INVENTOR(S)       : Sandhu It is certified that error appears in the above-identified patent and that said Letters Patent is hereby corrected as shown below:

On Title page, Item (56), under "OTHER PUBLICATIONS", in column 2, line 1, after "415.*" delete "Bruek,".

On Title page, Item (56), under "OTHER PUBLICATIONS", in column 2, line 2, before "S.R.J.," insert -- Bruek, --.

On Title page, Item (56), under "OTHER PUBLICATIONS", in column 2, line 6, delete "Dekkar," and insert -- Dekker, --, therefor.

In column 1, line 10, delete "Patterning" and insert -- Patterning. --, therefor.

In column 14, line 35, in claim 34, delete "intergrated" and insert -- integrated --, therefor.

Signed and Sealed this
Twenty-eighth Day of February, 2012

David J. Kappos
*Director of the United States Patent and Trademark Office*